United States Patent
Williams et al.

(10) Patent No.: US 9,640,381 B2
(45) Date of Patent: *May 2, 2017

(54) PROCESS FOR PLASMA TREATMENT EMPLOYING CERAMIC-FILLED POLYMER COMPOSITE PARTS

(75) Inventors: Scott Howard Williams, Pleasanton, CA (US); Richard William Campbell, Reinholds, PA (US); Stephan Glander, Wettswil (CH)

(73) Assignee: QUADRANT EPP AG, Lenzburg (CH)

( * ) Notice: Subject to any disclaimer, the term of this patent is extended or adjusted under 35 U.S.C. 154(b) by 302 days.

This patent is subject to a terminal disclaimer.

(21) Appl. No.: 14/111,086

(22) PCT Filed: Apr. 10, 2012

(86) PCT No.: PCT/EP2012/056419
§ 371 (c)(1),
(2), (4) Date: Dec. 10, 2013

(87) PCT Pub. No.: WO2012/139997
PCT Pub. Date: Oct. 18, 2012

(65) Prior Publication Data
US 2015/0041433 A1    Feb. 12, 2015

Related U.S. Application Data

(63) Continuation-in-part of application No. 13/083,730, filed on Apr. 11, 2011, now Pat. No. 9,129,795.

(51) Int. Cl.
*C23C 16/00* (2006.01)
*C23F 1/00* (2006.01)
*H01L 21/306* (2006.01)
*H01L 21/02* (2006.01)
*H01J 37/32* (2006.01)
*C08G 73/14* (2006.01)
*C08L 79/08* (2006.01)
*C08L 71/00* (2006.01)
(Continued)

(52) U.S. Cl.
CPC .............. *H01L 21/02* (2013.01); *C08G 73/14* (2013.01); *C08L 71/00* (2013.01); *C08L 79/08* (2013.01); *C08L 81/02* (2013.01); *C08L 81/06* (2013.01); *H01J 37/32495* (2013.01); *C08G 2650/40* (2013.01)

(58) Field of Classification Search
CPC .... H01J 37/32495; H01L 21/02; C08L 81/02; C08L 81/06; C08L 71/00; C08L 79/08; C08K 3/34; C08K 3/38; C08G 2650/40
USPC .................... 156/345.43–345.47; 118/723 E
See application file for complete search history.

(56) References Cited

U.S. PATENT DOCUMENTS 5,376,213 A * 12/1994 Ueda et al. ............... 156/345.27
5,407,992 A *  4/1995 Lee ......................... B29C 59/16
                                                             427/250
(Continued)

FOREIGN PATENT DOCUMENTS

EP    1 464 676 A1    10/2004

*Primary Examiner* — Rakesh Dhingra
(74) *Attorney, Agent, or Firm* — Brooks Kushman P.C.

(57) ABSTRACT

Internal components of plasma reactors are composed of a toleratable, ceramic filled plasma-useful polymer such as a high temperature engineering thermoplastic, preferably a polyamideimide or polybenzimidazole. The parts exhibit a low erosion rate upon exposure to plasma at low pressure.

2 Claims, 2 Drawing Sheets

(51) Int. Cl.
*C08L 81/02* (2006.01)
*C08L 81/06* (2006.01)

(56) References Cited

U.S. PATENT DOCUMENTS

| | | |
|---|---|---|
| 6,074,488 A | 6/2000 | Roderick et al. |
| 6,148,765 A | 11/2000 | Lilleland et al. |
| 6,165,276 A | 12/2000 | Lu et al. |
| 6,490,144 B1 * | 12/2002 | Narendrnath ..... H01L 21/67098 361/234 |
| 6,726,799 B2 | 4/2004 | Koike |
| 7,252,738 B2 | 8/2007 | Tong et al. |
| 7,544,270 B2 | 6/2009 | Wege et al. |
| 7,670,688 B2 | 3/2010 | Kaushal et al. |
| 7,779,784 B2 | 8/2010 | Chen et al. |
| 7,850,779 B2 | 12/2010 | Ma et al. |
| 2002/0086545 A1 * | 7/2002 | O'Donnell et al. .......... 438/710 |
| 2002/0185229 A1 | 12/2002 | Brcka et al. |
| 2003/0165689 A1 | 9/2003 | Miller et al. |
| 2006/0118519 A1 * | 6/2006 | Delgadino et al. ............. 216/67 |
| 2008/0236744 A1 * | 10/2008 | Furuse et al. ............. 156/345.1 |
| 2009/0047048 A1 * | 2/2009 | Ikeda ................ G03G 15/2057 399/333 |
| 2009/0155479 A1 * | 6/2009 | Xiao ........................ C23C 4/06 427/451 |
| 2010/0140222 A1 * | 6/2010 | Sun et al. ....................... 216/67 |

\* cited by examiner

PROCESS FOR PLASMA TREATMENT EMPLOYING CERAMIC-FILLED POLYMER COMPOSITE PARTS

CROSS-REFERENCE TO RELATED APPLICATIONS

This application is the U.S. National Phase of PCT Appln. No. PCT/EP2012/056419 filed Apr. 10, 2012 which is a continuation in part and claims priority to U.S. application Ser. No. 13/083,730 filed Apr. 11, 2011.

BACKGROUND OF THE INVENTION

1. Field of the Invention

The invention pertains to industrial processes involving plasma treatment, in which parts of a plasma treating apparatus which are exposed to plasma are constructed of ceramic filled, plasma-useful polymer.

2. Background Art

While plasma is as old as the universe itself, it was first identified as "radiant matter", by Sir William Crookes in 1879, and its nature first described by Sir J. J. Thompson in 1897. "Plasma", the term coined by Irving Langmuir in 1928, is now considered a fourth state of matter, and is a gas in which a certain portion of particles are ionized. The presence of a non-negligible number of charged particles renders plasma, unlike an ordinary gas, electrically conductive. Plasma may be generated by natural sources such as lightning discharges, but industrially useful plasmas are generated by application of electric and/or magnetic fields. Plasmas generated at low pressures include glow discharge plasmas, capacitively and inductively coupled plasmas, and wave heated plasmas. Plasmas generated at atmospheric pressure include arc discharge, corona discharge, capacitive discharge, and dielectric barrier discharge.

Plasmas have become important industrially in many applications. For example, so-called "corona treatment", which is technically treatment by dielectric barrier discharge, is widely used to alter the surface of thermoplastics by etching and surface functionalization to render the surfaces more acceptive of paints, metal coatings, and adhesives. More recently, plasmas have become very important in the processing of semiconductor wafers and in the fabrication of electronic devices on these wafers. One example of the use of plasma in such applications is Plasma-Enhanced CVD, or "PECVD". In PECVD, a strong electric field ignites a plasma between two electrodes, one of which holds a substrate. The plasma cracks the bonds of the CVD process gas, thus enhancing the role of deposition onto the substrate. Silicon may be deposited from silane by PECVD, for example.

Plasma etching is another common process in semiconductor device fabrication. Here, the plasma produces chemically reactive species from process gases, which react with atoms of the substrate to create volatile species. Ion implant processing, used to create sublayers of different chemical makeup from that of the substrate by ion bombardment, is also a plasma process. These are but few of many examples.

Common to all these plasma processes is the generation of a highly energetic, aggressive, reactive, and corrosive plasma, generally under vacuum conditions. It is just these qualities which make plasma and plasma assisted processes highly efficient. Yet, as is readily imagined and well documented, these properties also take their toll on process equipment. Thus, the portions of the reactor which are exposed to plasma, whether directly or indirectly, and even unintentionally or unavoidably, must be chemically resistant. The low pressures common to many plasma treatments encourages loss of ions and low molecular weight species from components exposed to plasma.

Chemical resistance is necessary in all plasma treatment apparatuses, since erosion of the surface of an apparatus component not only can destroy its net shape, but can also cause chemical degradation which compromises properties such as strength and modulus. Because such processes are generally conducted in moderately high to high vacuum, undesirable outgassing of degradation products may occur. Finally, particulate matter may spall off from eroded surfaces, contaminating the surface of the substrate. In the processing of semiconductor devices, even particles in the low nanometer range can be fatal to the operation of a central processing unit, or memory units such as RAM, DRAM, or SDRAM.

For these reasons, consumable parts in plasma processing chambers have been traditionally made of high temperature inorganic materials such as quartz, fused silica, sapphire (fused alumina), or ceramics such as those prepared from silica, ceria, and alumina. Silicon carbide has also been used, as a coating or as a ceramic material per se, as has also boron nitride. Examples of such parts include assembly screws such as cap screws, wall liners, wafer passage liners, pin lifters, clamp rings, edge rings, a variety of inserts and shields, etc. Examples of such parts may be found in U.S. Pat. No. 6,165,276, and in numerous manufacturers' brochures, for example those from Technics, Tegal, Novellus, and Applied Materials, to name but a few. Due to the expense of the base material, plus the difficulties of machining these exceptionally hard and often brittle components, their cost is quite high. Moreover, they are often brittle and easily damaged.

Manufacturers have long sought to replace such consumable parts with parts of less expensive and more easily machinable materials, but without great success. Metals are generally prohibited, since even the smallest trace amounts of metals can severely compromise integrated circuit behavior. Thus, metals can only be used where there will be no erosion of the metal surface, or where the metal surface is coated with a ceramic material, an expensive process. Many refractory or ceramic materials are also unsuitable, due to contamination of semiconductor substrates with metals. Titanium dioxide is one such material.

U.S. Pat. No. 7,670,688, for example, discloses erosion resistant parts coated with oxides of yttrium, preferably yttria or yttrium aluminum garnet. U.S. Pat. No. 6,074,488 discloses a number of erosion resistant materials. U.S. Pat. No. 6,726,799 discloses the continued need to compensate for erosion of components, proposing an apparatus modification to raise the focus ring of a plasma etching apparatus to compensate for wear rather than constantly replacing the ring.

US 2002/0086545 discloses a corrosion resistant component of a plasma chamber including a liquid crystalline polymer (LCP). In particular, the LCP that was used is VECTRA® LCP, which is a registered trademark of Celanese AG, or ZENITE® LCP, which is a registered trademark of E.I. Du Pont de Nemours and Company. In one embodiment, the LCP includes one or more fillers such as glass or mineral fillers. Although LCPs are successfully used in a many high-end applications, they have the disadvantage of being comparatively costly. Moreover, the high stiffness of LCPs requires processing under high shear conditions to orient the crystal regions. This is particularly feasible for injection molding of small parts. In contrast, larger parts such as those used in plasma focus rings for example made by extrusion, compression molding and even injection molding typically are made using low shear conditions and as a result the high modulus properties are not developed.

More conventional, non-LCP type polymers would thus be an excellent choice for reactor internals, provided that they are capable of meeting the materials requirements. However, the fact that polymer surfaces have been plasma modified for decades contravenes the perceived usefulness of polymers. Moreover, because many plasma treatments involve exposure of internal parts to temperatures above 250° C., the choice of polymers is limited to the engineering thermoplastics such as polyether ketone (PEK), polyetheretherketone (PEEK), their variants such as PEKK, polysulfones, polyethersulfones (PES), polyetherimides (PEI), high temperature polyamides, polyamideimides (PAI), polybenzimidazole (PBI), perfluoroalkoxy polymer (PFA) and the like, and thermoset polymers such as those based on epoxy resins, bismaleimides, aromatic cyanates, and the like.

In order to be useful in a plasma apparatus, the polymer must not only meet the temperature requirements and possess adequate mechanical strength and modulus, but it must also be resistant to the plasma environment as well as being free of outgassing and generation of particulates, both as initially installed and after prolonged use.

Etching environments are in general the most severe in plasma processing. There are predominately four plasma-gas mixtures representative of commercial use. These are 100% $O_2$ (typical of preclean etch); 95% $CF_4$/5% $O_2$ (silicon etch); 50% $CHF_3$/25% HBr/12.5% $O_2$/12.5% $Cl_2$ (polysilicon glass etch); and 75% $Cl_2$/25% HBr (main etch). Even without generation of plasma, the corrosive nature of many of these etching mixtures is readily apparent. Their activation by plasma renders them far more energetic and corrosive than the gas mixtures per se.

Attempts to replace plasma reactor parts with less expensive and more easily processed thermoplastics have been done, but for the most part have been disappointing. Prior to the present invention, the only polymers which have achieved limited success were polyimide polymers such as Vespel® SP-1 polyimide, a product of DuPont. However, the erosion rate in oxygen plasma is far higher than satisfactory. The industry has continued to seek for a thermoplastic material which can be used in plasma reactors under plasma exposure conditions.

US 2008/0236744 discloses various polymers as being "plasma resistant". However, these polymers necessarily have to include conductive particles. The conductive particles make sure that the polymer coating is at the same potential of the chamber wall and thus plasma electrical discharges will not reach the wall, thus avoiding wall corrosion.

SUMMARY OF THE INVENTION

It has now been surprisingly and unexpectedly discovered that parts of plasma reactors which are exposed to plasma can be fabricated from ceramic particle-filled, plasma-useful polymers selected from the group consisting of polyimides, polyamideimides, polyetherketones, polysulfones, polybenzimidazole, perfluoroalkoxy polymer, and polyarylenesulfides. The composite parts exhibit useful lifetimes with lessened corrosion and little particulates generation, and can be fabricated at considerably reduced cost compared to parts of ceramic or fused refractory materials, or quartz. Moreover, the parts thus fabricated are far more resistant to breakage. Still further, there is no need to include any conductive particles, and the parts can be non-conductive electrically.

Figure 1:
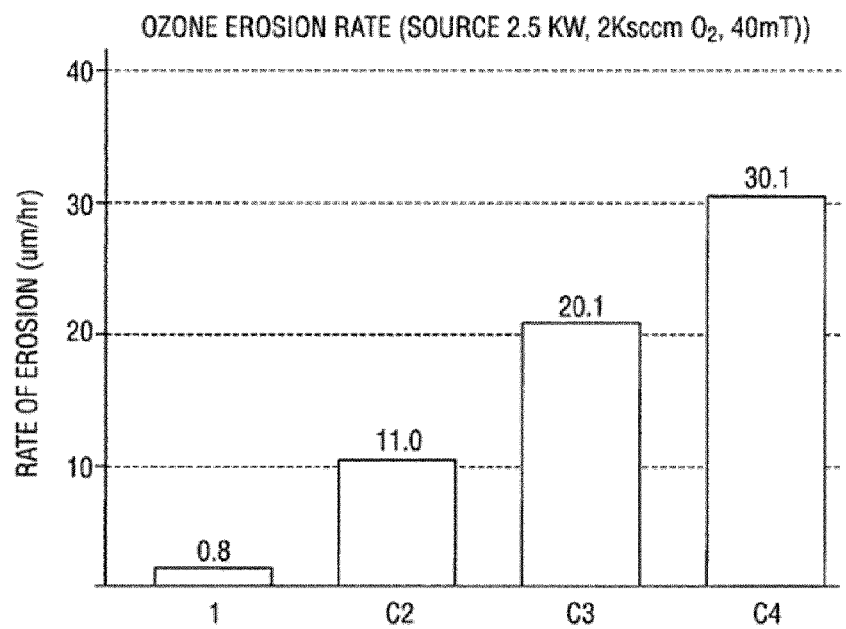
FIG. 1 illustrates the improvement in erosion brought about by the ceramic filled polymers of the invention, in a low pressure oxygen plasma at 2.5 KW electrode power.

In these figures, examples are generally denoted with numbers in accordance with the description further below, whereas comparative examples are additionally marked with a prefix "C".

DETAILED DESCRIPTION OF THE PREFERRED EMBODIMENT(S)

The composite parts of the present invention are prepared from plasma-useful polymers selected from the group consisting of polyimides, polyamideimides, polyetherketones, polysulfones, polybenzimidazoles, perfluoroalkoxy polymer, and polyarylenesulfides. Polyamideimides are preferred, and such resins are available from Solvay Advanced Polymers under the trademark Torlon®. Polyamideimides are also available under the unregistered trademark Tecator™ from Ensinger Industries, Inc., Washington, Pa. Polyamideimides are amorphous, thermoplastic polymers containing both amide and imide linkages, and can be made by several manufacturing methods. The manufacturing method is not critical. However, the molecular weight, as reflected by the polymer properties, is desirably high. Preferred polyamideimides have a tensile strength, measured by ASTM D638, in excess of 80 MPa, preferably in excess of 100 MPa, and most preferably in excess of 120 MPa; and a 264 psi heat deflection temperature per ASTM D648 of 270° C. or higher, preferably about 280° C. or higher. Another preferred polymer is polybenzimidazole (PBI). PBI is the highest temperature commercially available polymer that can easily be molded into shapes. It shows no glass transition or melting point below 425° C. so, except for its inherent susceptibility to the erosive effects of the plasmas, it is well suited for use in the hot areas of plasma etch in place of the expensive and fragile ceramics and quartz. PBI will be preferred for use in applications where higher resistance of heat is desired, generally due to higher electrode power within the chamber. Therefore, materials using PBI as a base resin will be more likely to be used in PECVD and CVD process tools.

The use of other plasma-useful polymers such as perfluoroalkoxy polymer (PFA), polyimide polymers, polyetherketone polymers, polysulfones (PS) and polyarylenesulfides (PPS is also possible. Such polymers are also commercially available, e.g. polyimide polymers are available from DuPont under the tradename Vespel®, and polybenzimidazole polymers are available from Quadrant Engineering Plastic Products under the tradename Celazole® PBI. Polyetheretherketones (PEEK) are available from Victrex Manufacturing Ltd. as Victrex® PEEK™ polymers. By the term "polyetherketone" is meant polyetherketones and their variants such as polyetheretherketones, and the like, which are well known engineering thermoplastics, and which are commonly referred to in the industry as PEK, PEEK, PEKK, PEKEKK, PAEK, and the like. Properties and processing of such high temperature thermoplastics is described in numerous references, such as ENGINEERING THERMOPLASTICS, Properties and Applications, J. Margolis, Ed., ©1985, Marcel Dekker, N.Y. By the term "polysulfone" is also meant polysulfone variants such as polyethersulfones and the like. Perfluoralkoxy polymer (PFA) is available from DuPont under the tradename Teflon® PFA. All these polymers herein are referred to hereafter as "plasma-useful polymer(s)". This term should not be interpreted to include polymers other than those mentioned. Plasma useful polymers should have a melting or softening point above 200° C., preferably greater than 250° C., and more preferably above 300° C.

The plasma-useful polymer, preferably a polyamideimide or a polybenzimidazole, is ceramic filled. By "ceramic filled" means that the polymer contains ceramic or fused refractory particles as a filler, generally in amounts of from 5 to 40 weight percent, more preferably 10 to 35 weight percent, and most preferably from 10 to 30 weight percent. A single filler may be used, or a combination of one or more fillers may be used. A 20% filler loading is especially preferred in many applications.

The ceramic filler must also meet additional requirements in the amount employed. The filler must be a "tolerable filler" in the sense that in the particular plasma process in which the ceramic filler is employed, the metal of the ceramic filler must be not one which will be liberated from the ceramic during plasma processing and contaminate the substrate being plasma treated with undesirable metal or metal ions. For example, in semiconductor processing, the use of ceramics containing appreciable amounts of titanium, copper, iron, or other heavy metals is contraindicated. In semiconductor plasma processing, for example, alumina, boron nitride, and silicon carbide have been found to be especially useful, since any elements liberated from the ceramic particles either do not interfere with semiconductor processing, or are not liberated in sufficient amounts to interfere with semiconductor processing. The tolerable filler must also be a filler which reduces erosion of the filled polymer to a low level under the plasma operating conditions.

The mean size of the ceramic filler can be within a wide range, but again, this range is dictated in part by the particular plasma process, the substrate being plasma treated, and the nature of the combination of filler and polymer. Combinations of particles may be used. The degree of weight loss of the component part used in a plasma treating reactor, for example, is impossible to predict based on the characteristics of either the ceramic filler alone or the polymer alone. It is the combination which must be assessed. The particle size also plays a part in this assessment. Assessment of a given combination of ceramic filler particles and polymer may be made by one skilled in the art without undue experimentation. The assessment generally is made by fabricating a part or test coupon for assessment and exposing this part to the conditions expected in a plasma reactor for that part, and measuring the weight loss or other important characteristics such as part thickness or particle generation, over time. The time period must be such so as to at least qualitatively determine performance. In plasma semiconductor processes, for example, a time period of 30 to 50 hours may be suitable. Weight loss is easily determined by simply measuring the initial and subsequent weights of the part over time. Particle generation may be measured by trapping particles exiting the plasma reactor in a fine filter, or, in the case of semiconductor substrates, can be measured by traditional particle measurement methods such as light scattering, and the like.

The filler mean particle size is preferably from 100 nm to 100 µm, more preferably 500 nm to 50 µm, and most preferably from 1 µm to 20 µm. A most preferred range of particle sizes is a mean particle size of 4 µm to 20 µm. Particle size may be measured by conventional methods such as laser scattering, or instruments such as a Malvern particle sizer. A monomodal or multimodal particle size distribution of filler particles may be used. It is preferable that very small particles such as those in the range, for example of 1 nm to <100 nm, preferably 1 nm to 50 nm be avoided, as even with the relatively low amount of erosion of the filled polyamideimide parts which takes place, liberation of such small particles from the part surface may occur.

Preferred ceramic materials include ceramics such as ceria, yttria, alumina, silica, yttrium aluminum garnet, other heavy transition metal garnet materials, aluminosilicates, boron carbide, boron nitride, silicon carbide, etc. This list is exemplary, and not limiting. Fused refractory materials include crushed sapphire and quartz glass. The choice of ceramic particle material is not particularly limiting. A preferred ceramic filler is boron nitride, having a mean particle size of about 9 µm.

Without being bound to any particular theory, it is believed that the use of particles especially in the range of 1 µm to 100 µm, preferably 1 µm to 20 µm, results in retention of the particles in the polymer matrix, even though the surrounding polymer may be eroded by the plasma, the particles still being adhered to the polymer matrix at their bottom surfaces. At the same time, it is believed that the size of the particles, in conjunction with their concentration, lowers the ability of the plasma to further erode the polymer between the particles. Very small particles will not show these characteristics, and will show increased polymer erosion as well as exfoliation of particles. A suitable ceramic particle size is easily assessed by the methods described previously. Weight loss and particle generation are the key parameters. It is noted that in some plasma processing, particle generation is not relevant. In these processes, weight loss is the preferred assessment method.

Figure 2:
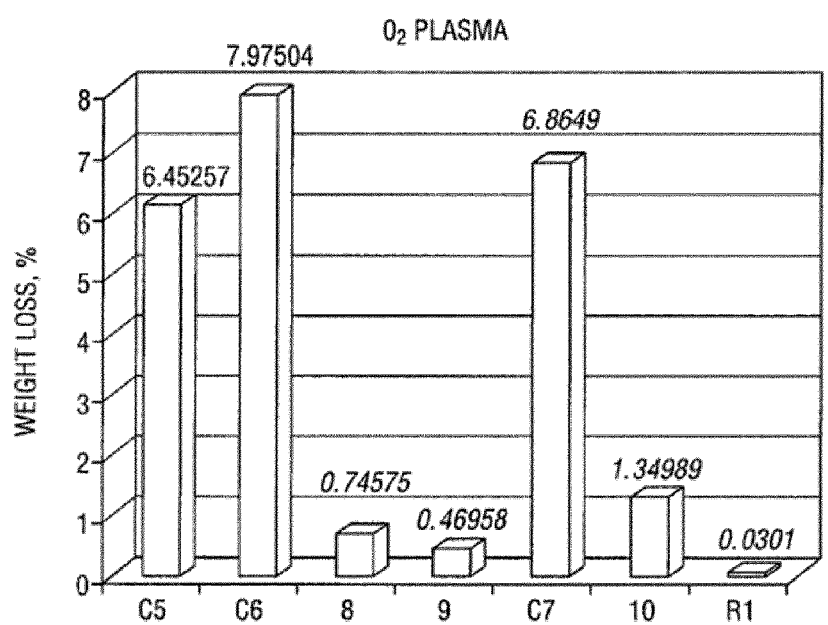
FIG. 2 illustrates erosion, as percentage weight loss, of several materials in a 1 KW electrode power, low pressure oxygen plasma.

Preferably, weight loss is measured in an oxygen plasma under conditions suitable for semiconductor processing. In an oxygen plasma at 0.365 Torr, with $O_2$ being supplied at 1200 SCCM at an energy of 1 Kw, a total weight percentage weight loss after 50 hours should be less than 2%, more preferably less than about 1%, and most preferably about 0.5 weight percent or less. Weight losses under these conditions are shown in FIGS. 1 and 2, FIG. 2 showing total percentage weight loss.

The ceramic filler is added to the polymer by conventional methods, for example by incorporation in kneading devices, mixers, or extruders. The filler may also be incorporated by blending the filler with the polymer, followed by extrusion, injection molding, or compression molding.

Preferably, the composite is molded by extrusion into a desired shape, for example a tube, rod, or sheet, or compression molded into one of these shapes. Since the part will usually be machined to its final shape, a molded shape which is near net shape is desirable whenever possible. For many applications the parts shall be non-conductive electrically.

Although silicon carbide, boron carbide, and boron nitride are very tolerable ceramic fillers with respect to semiconductor processing because the components of the filler are generally contained in the silicon substrate, particularly when grown by the most often used Czochralski crystal growth process, it has been surprisingly and unexpectedly found that boron nitride, despite its high hardness, is more easily incorporated into the polymer by conventional methods. Ranges of from 10 to 30 weight percent boron nitride have been found to be especially useful. The concentration of boron nitride is somewhat dependent upon the particular plasma process. For oxygen plasmas, a loading of 20 weight percent has been found to be slightly more effective than loadings of 10 or 30 weight percent, which illustrates that the erosion is not merely a function of the ceramic filler alone. Under these conditions all the boron nitride-filled polyamideimides performed better than the unfilled resin, with performance approaching that of quartz, which is widely used. Upon exposure to 1 KW $CF_4$ plasma at 0.032 Torr, however, 30% by weight boron nitride proved to be superior to either 20% or 10% boron nitride.

Plasma reactors are well known and are available from numerous sources worldwide, for example from Applied Materials, and thus a detailed description of plasma reactors is unnecessary. Plasma reactors have also been thoroughly discussed in the literature. See, e.g. HANDBOOK OF SEMICONDUCTOR MANUFACTURING TECHNOLOGY, R. Doering, Ed., CRC Press, ©2008. Plasma reactors for plasma-assisted deposition are described in U.S. Pat. Nos. 6,165,276 B2; 6,726,799 B2; 7,252,738 B2; 7,544,270 B2; 7,779,784 B2, and 7,850,779 B2, which are incorporated herein by reference.

Applications for the inventive composite parts can be subdivided into three categories, each of which has somewhat different properties. In "near electrode" applications, a polymer service temperature of 350° C. is minimally required. The composite must have near ionic purity, high resistance to plasma, and preferably be capable of surviving energized ozone. For "direct plasma" applications, the part is spaced apart from the electrodes, but will still experience relatively high direct contact by plasma. An example is a confinement ring. In these applications, minimum heat resistance of 250° C. is necessary, and again, very high ionic purity and ability to survive direct plasma attack is necessary. In "indirect plasma" applications, some exposure to plasma is expected, but the plasma will have lower energy or lesser concentration. Examples are clamp rings, chucks, plates, and screws. These must be capable of withstanding operating temperatures of 150° C., must possess excellent chemical resistance, and, in applications where the part contacts semiconductor wafers, high ionic purity.

Currently, near electrode applications are dominated by quartz (low energy) and silicon carbide (high energy), while direct plasma applications are dominated by quartz. Indirect plasma applications are dominated by ceramics, and where polymers have been used in the past, by Vespel® polyimide.

The invention may be further understood by way of the following examples and comparative examples.

EXAMPLES

Plasma chamber base rings were machined as a 14 inch (355 mm) external diameter, 13 inch (330 mm) internal diameter rings with a thickness of 8 mm. The rings were machined from extruded polyamideimide Torlon 4200 from Solvay, to which is added 20% by weight boron nitride powder having a mean particle size of 9 μm (Example 1). The properties of the filled and unfilled polyamideimide are given below:

| Property | Test Method | Example 1 | Torlon 4200 (unfilled) |
|---|---|---|---|
| Specific Gravity | ASTM D792 | 1.50 | 1.41 |
| Tensile Strength | ASTM D638 | 16,900 | 20,000 |
| Tensile Modulus psi | ASTM D638 | 1,200,000 | 600,000 |
| Flex Modulus psi | ASTM D790 | 1,050,000 | 600,000 |

Sample coupons were machined as in Example 1, using unfilled Torlon® polyamideimide (Comparative Example C2), Vespel® SP-1 polyimide (Comparative Example C3), and Ultra High Purity PEEK (Comparative Example C4). Testing Testing was performed in a standard plasma etching chamber available from Applied Materials as an AMAT Enabler chamber. The atmosphere was oxygen, which is very aggressive, and the plasma source power was 2.5 kW, which is currently at or near the high end of useful plasma power. Oxygen was supplied at 2K sccm, and the pressure in the chamber was maintained at 40 mT. The erosion was measured by the decrease in sample thickness before and after plasma exposure, and reported in bar graph form in FIG. 1, with the Example and Comparative Examples identified on the horizontal axis.

The results are highly surprising and unexpected, the unfilled polyamideimide being eroded at a rate more than ten times the rate of the inventive ceramic filled polymer. The base polymer itself is thus clearly not responsible for this improvement. The results show an erosion rate more than 20 times slower than Vespel® polyimide, the default thermoplastic currently being used, and more than 30 times lower than PEEK, a well known high performance engineering thermoplastic.

Test coupons of polyimide (Vespel® SP-1) (Comparative Example C5) PEEK (Comparative Example C6); Torlon® polyamideimide (Comparative Example C7), Quartz (Reference Example R1), and Torlon® polyamideimide with three loadings of boron nitride particles, 30% (by weight) (Example 8), 20% (Example 9), and 10% (Example 10), and exposed to a 1KW $O_2$ plasma at 1200 SCCM and pressure of 0.365 torr. The coupons were weighed prior to and after exposure for 50 hours. The percentage weight loss is illustrated in FIG. 2, again with the Examples, Comparative Examples, and Reference Example identified on the horizontal axis.

FIG. 2 shows that the BN-filled polyamideimide had much lower erosion, as reflected by weight loss, of unfilled polyamideimide, PEEK, or polyimide. All three unfilled polymers were similar in performance with high weight loss.

In a similar manner test coupons of unfilled polyimide (Comparative Example C 11), unfilled PEEK (Comparative Example C12), unfilled polyamideimide (Comparative Example C13) and polyamideimide containing 20 weight percent of boron nitride powder as a filler (Example 14) were exposed to a 2KW oxygen plasma, $O_2$ at 1200 sccm, pressure 0.30 torr, for 50 hours, and the percent weight loss was measured. The results are presented below:

| Test Coupon | Weight Loss, % |
|---|---|
| quartz (reference) | 1.5 |
| Comparative Example C11 | 36 |
| Comparative Example C12 | 56 |
| Comparative Example C13 | 30 |
| Example 14 | 6.0 |

As can be seen, the inventive Example 14 showed a surprisingly and unexpectedly low weight loss.

Figure 3:
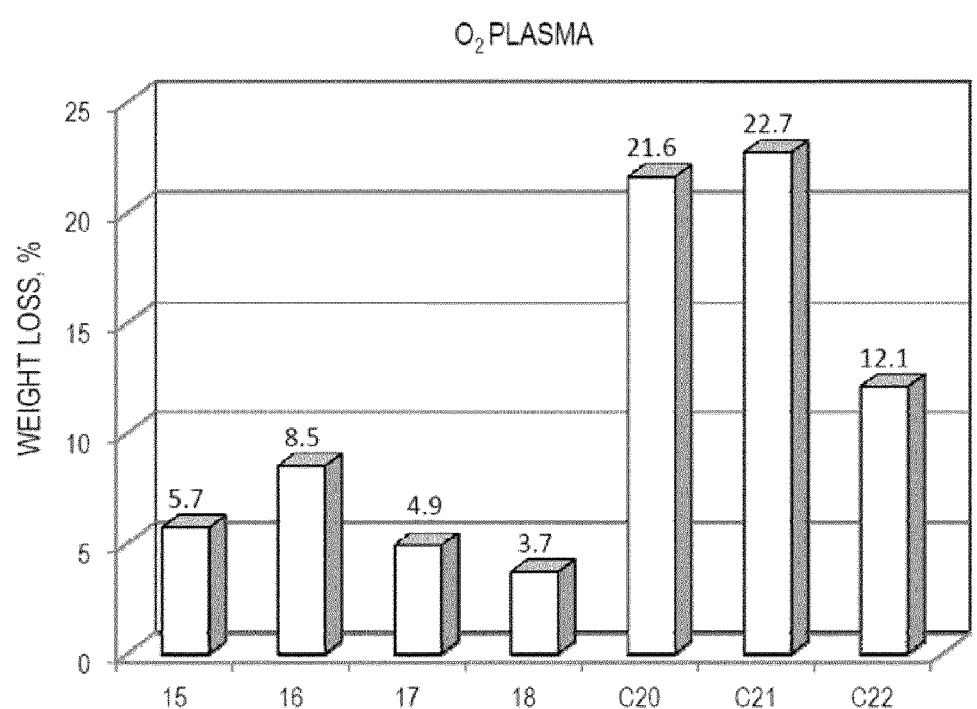
FIG. 3 illustrates erosion, as percentage weight loss, of several materials in a 2 KW electrode power, low pressure oxygen plasma.

In a further series of measurements, test coupons of polyamideimide containing 20 weight percent of boron nitride powder as a filler (Example 15), polyimide (#2) containing 20 weight percent of boron nitride powder as a filler (Example 16), polybenzimidazole containing 20 weight percent of silicon carbide powder as a filler (Example 17), polybenzimidazole containing 20 weight percent of boron nitride powder as a filler (Example 18), "recured" polyamideimide (see below) containing 20 weight percent of boron nitride powder as a filler (Example 19), as well as as test coupons containing unfilled polyimide (#1) (Comparative Example 20), unfilled polyimide (#2) (Comparative Example 21), unfilled polybenzimidazole (Comparative Example 22), and also perfluoroalkoxy polymer containing 20 weight percent of boron nitride powder as a filler (Example 23) and unfilled perfluoroalkoxy polymer (Comparative Example 24) were exposed to a 2KW oxygen plasma, $O_2$ at 1200 sccm, pressure 0.30 torr, for a shorter period of 25 hours, and the percent weight loss was measured. The results are presented below and partially in FIG. 3:

| Test Coupon | Weight Loss, % |
|---|---|
| Example 15 | 5.7 |
| Example 16 | 8.5 |
| Example 17 | 4.9 |
| Example 18 | 3.7 |
| Example 19 | 2.7 |
| Comparative Example 20 | 21.6 |
| Comparative Example 21 | 22.7 |
| Comparative Example 22 | 12.1 |
| Example 23 | 1.2 |
| Comparative Example 24 | 14.7 |

As can be seen from the above results, the addition of filler improves resistance against plasma induced weight loss in all cases examined. A particularly strong, more than 10-fold effect was found between filled and unfilled perfluoroalkoxy polymer (Example 23 vs. Comparative Example 24). Furthermore, a comparison between Example 15 and Example 19, both referring to polyamideimide containing 20 weight percent of boron nitride powder, shows that a further curing step (i.e. with a first curing step in the plate or rod as extruded, then again after machining of the test specimen) leads to a further substantial improvement in resistance against plasma induced weight loss. This beneficial effect of a further curing step is already known for unfilled polyamideimide and is shown here to hold true for filled polyamideimide as well.

By the term "consists essentially of" with respect to any particular filler is meant that any additional filler, regardless of type or amount, does not substantially alter the erosion performance of the ceramic-filled polymer as opposed to a polymer containing only the same amount of the particular ceramic filler. In particular, for example, when the filler is boron nitride, the addition of non-boron nitride filler in addition to boron nitride, where the erosion performance is neither increased nor decreased by ±10%, is contemplated by this language.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

The invention claimed is:

1. A plasma treating apparatus having a vacuum chamber adapted to receive a substrate to be plasma treated, and at least one apparatus component which is exposed to plasma in an interior of the apparatus, wherein the apparatus component is constructed of a plasma-useful polymer filled with from 5 to 40 weight percent of toleratable ceramic particles based on the total weight of plasma-useful polymer and toleratable ceramic, wherein the plasma-useful polymer comprises a recured polyamideimide polymer, and wherein the toleratable ceramic filler comprises boron nitride.

2. A plasma treating apparatus having a vacuum chamber adapted to receive a substrate to be plasma treated, and at least one apparatus component which is exposed to plasma in an interior of the apparatus, wherein the apparatus component is constructed of a plasma-useful polymer filled with from 5 to 40 weight percent of toleratable ceramic particles based on the total weight of plasma-useful polymer and toleratable ceramic, wherein the plasma-useful polymer comprises a polyamideimide polymer, and wherein the toleratable ceramic filler comprises boron nitride.

* * * * *